United States Patent [19]
Hughes

[11] Patent Number: 6,147,518
[45] Date of Patent: Nov. 14, 2000

[54] CURRENT COMPARATOR

[75] Inventor: John B. Hughes, Hove, United Kingdom

[73] Assignee: U.S. Philips Corporation, New York, N.Y.

[21] Appl. No.: 09/162,838

[22] Filed: Sep. 29, 1998

[30] Foreign Application Priority Data

Oct. 1, 1997 [GB] United Kingdom .................... 9720712

[51] Int. Cl.$^7$ .................................................. G11C 27/02
[52] U.S. Cl. .................................. 327/65; 327/55; 327/94
[58] Field of Search ................................. 327/91, 94, 96, 327/64, 65, 54, 55, 57, 95, 67

[56] References Cited

U.S. PATENT DOCUMENTS

| | | | |
|---|---|---|---|
| 5,400,273 | 3/1995 | Hughes et al. ............................. | 365/45 |
| 5,689,205 | 11/1997 | Hughes et al. ............................ | 327/335 |
| 5,714,894 | 2/1998 | Redman-White et al. ................ | 327/94 |
| 5,773,998 | 6/1998 | Hughes et al. ............................ | 327/91 |

FOREIGN PATENT DOCUMENTS

9618108A2  6/1996  WIPO .......................... G01R 19/165

OTHER PUBLICATIONS

"A Full Nyquist 15 MS/s 8–b Differential Switched–Current A/D Converter", By Mark Bracey et al, IEEE Journal of Solid–State Circuits, vol. 31, No. 7, Jul. 1996, pp. 945–951.

*Primary Examiner*—Timothy P. Callahan
*Assistant Examiner*—Terry L. Englund
*Attorney, Agent, or Firm*—Brian J. Wieghaus

[57] ABSTRACT

A current comparator comprises first (1) and second (2) inputs for receiving input currents to be compared. During a first phase (1*a*) of a clock period the input currents are sensed and stored on first (N1,S7) and second (N2,S8) current memory circuits. On a second phase (1*b*) of the clock period a switching arrangement (S1 to S4) inverts the input currents and applies them together with the currents stored in the first (N1,S7) and second (N2,S8) current memory circuits to a regenerative latch circuit (P1,P2,S9,S10). During a third phase (2*a*) of the clock period the comparator produces the comparison result at an output (3). During a fourth phase switches (S5,S6,S9,S10,S11) are operated to reset the comparator to its initial state.

10 Claims, 3 Drawing Sheets

CURRENT COMPARATOR

BACKGROUND OF THE INVENTION

This invention relates to a current comparator having first and second inputs for receiving first and second input currents, first and second current memory circuits for sensing and storing the received currents during a first phase of a clock period and reproducing said received currents during a second non-overlapping phase of said clock period, first and second cross coupled transistors forming a latching circuit, means for feeding the stored and an inverted version of the received currents to the latching circuit during said second phase and means for feeding an output of the latch circuit to an output of the comparator circuit during the third phase of the clock period.

Such a current comparator has been disclosed in EP-A-0 744 032, in related U.S. Pat. No. 5,714,894 and in a paper entitled "A Full Nyquist 15 MS/s 8-b Differential Switched-Current A/D Converter" by Mark Bracy, William Redman-White, Judith Richardson and John B Hughes published in IEEE Journal of Solid-State Circuits, Vol 31, No 7, July 1996 at pages 945 to 951. The folded structure of the input and latching circuits used has a number of penalties. First the bias current drain is 4 J plus the current in the local reference generator, that is the input stage has doubled the required bias current. Secondly, the input stage has a similar number of transistors to the latch so the complexity is nearly doubled. Thirdly, the input stage generates the same noise as the latch and so there is a 3 dB noise penalty.

SUMMARY OF THE INVENTION

It is an object of the invention to enable the provision of a current comparator in which the effect of one or more of the penalties referred to above is/are mitigated.

The invention provides a current comparator, first and second inputs for receiving first and second input currents, first and second current memory circuits for sensing and storing the received currents during a first phase of a clock period and reproducing said received currents during a second non-overlapping phase of said clock period, first and second cross coupled transistors forming a latching circuit, means for feeding the stored and an inverted version of the received currents to the latching circuit during said second phase and means for feeding an output of the latch circuit to an output of the comparator circuit during the third phase of the clock period, characterised in that the comparator further comprises means for disconnecting the cross-coupling of the first and second transistors during the first phase and connecting the first and second transistors as individual current sources each feeding a bias current to a respective one of the first and second memory circuits.

The comparator according to the invention has the advantage that the current drain is reduced since the folding structure of the prior art comparator is eliminated by using the latch transistors as bias current sources for the current memory circuits while the input currents are being sampled by the current memory circuits. This also reduces the input circuit complexity and noise generation due to the reduced number of components.

Further advantageous embodiments of the invention are disclosed in the dependent claims.

BRIEF DESCRIPTION OF THE DRAWINGS

The above and other features and advantages of the invention will be apparent from the following description, by way of example, of embodiments of the invention with reference to the accompanying drawings, in which.

DESCRIPTION OF THE PREFERRED EMBODIMENTS

Figure 1:
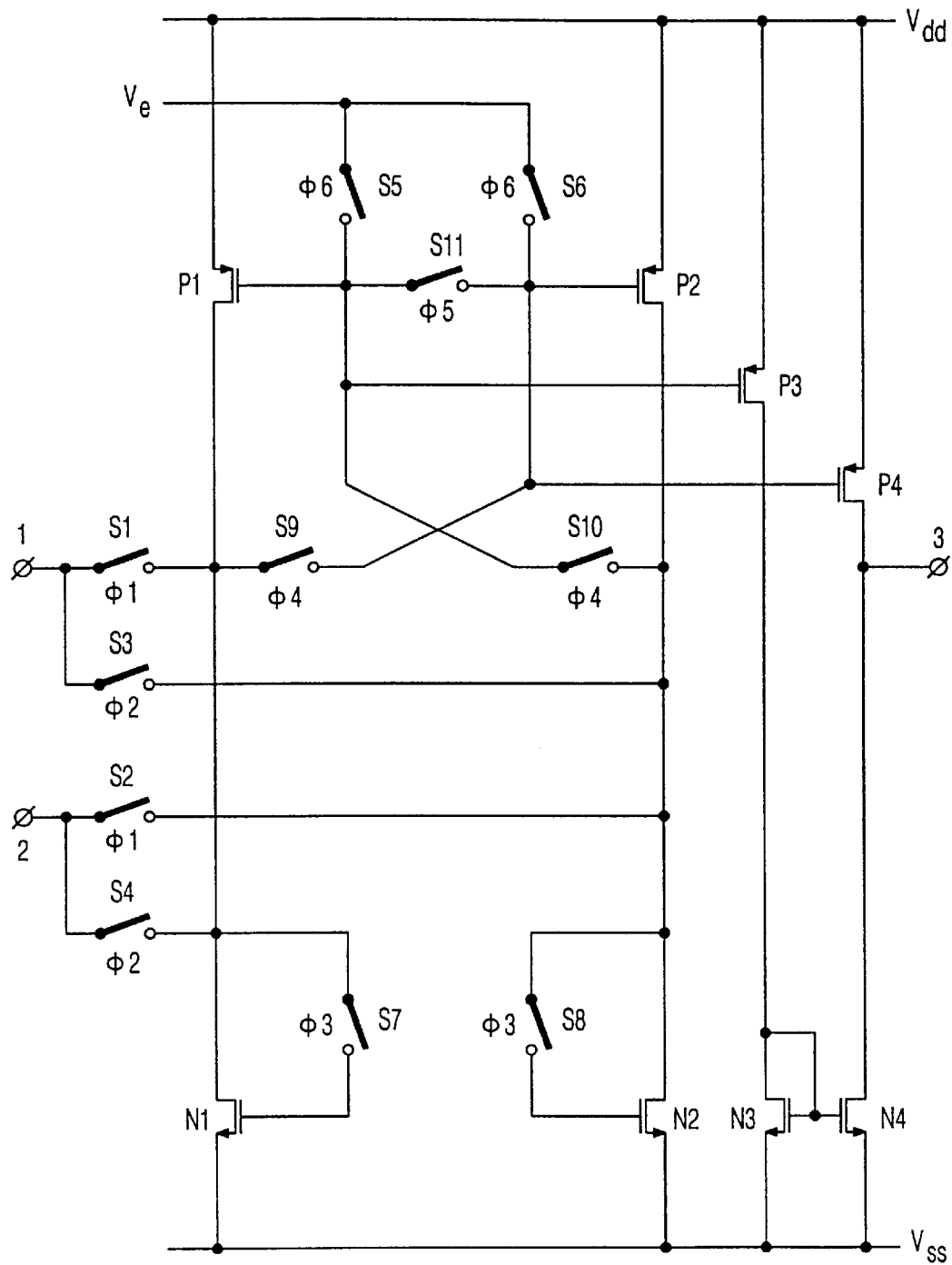
FIG. 1 is a schematic diagram of a first embodiment of a comparator according to the invention.

As shown in FIG. 1 the comparator has first and second inputs 1 and 2. The first input 1 is connected via a switch S1 to the junction of the drain electrodes of a p-channel field effect transistor P1 and an n-channel field effect transistor N1. The source electrode of the transistor P1 is connected to a supply rail $V_{dd}$ while the source electrode of the transistor N1 is connected to a supply rail $V_{ss}$. The second input 2 is connected via a switch S2 to the junction of the drain electrodes of a p-channel field effect transistor P2 and an n-channel field effect transistor N2. The source electrode of transistor P2 is connected to $V_{dd}$ while the source electrode of transistor N2 is connected to $V_{ss}$. The input 1 is further connected to the junction of transistors P2 and N2 via a switch S3 while the input 2 is further connected to the junction of transistors P1 and N1 via a switch to S4.

The gate electrodes of transistors P1 and P2 are connected to a bias voltage rail $V_e$ via switches S5 and S6 respectively. A switch S7 is connected between the gate and drain electrodes of transistor N1 while a switch S8 is connected between the gate and drain electrodes of transistor N2.

The circuit as described so far will, when switches S1,S2, S5,S6,S7 and S8 are closed, sense the input currents on inputs 1 and 2 and form two current memory circuits. The transistors P1 and P2 act as bias current sources to enable bi-directional currents to be sensed by the transistors N1 and N2. When switches S7 and S8 open the transistors N1 and N2 maintain the current sensed as is known in current memory circuits. Thus during a first phase when switches S1,S2,S5 and S6 are closed the comparator senses and stores the received input current.

The gate electrode of transistor P1 is connected via a switch S10 to the drain electrode of transistor P2 while the gate electrode of transistor P2 is connected to the drain electrode of transistor P1 via a switch S9. The gate electrodes of transistors P1 and P2 are coupled via a switch S11. The gate electrode of transistor P1 is connected to the gate electrode of a p-channel field effect transistor P3 while the gate electrode of transistor P2 is connected to the gate electrode of a p-channel field effect transistor P4. The source electrodes of transistors P3 and P4 are connected to $V_{dd}$ while their drain electrodes are connected to the drain electrodes of n-channel field effect transistors N3 and N4 respectively. The source electrodes of transistors N3 and N4 are connected to $V_{ss}$ while their gate electrodes are connected together and to the drain electrode of transistor N3. The junction of the drain electrodes of transistors P4 and N4 is connected to an output 3 of the comparator.

During a second phase switches S1,S2,S5,S6,S7,S8 and S11 are open and switches S3,S4,S9 and S10 are closed. Transistors P1 and P2 are now cross-coupled and are fed with the current stored during the first phase on transistors N1 and N2 and with the inverted version of the input current applied during the first phase. The input current inversion is achieved by the switching arrangement formed by switches S1 to S4. Thus, transistors P1 and P2 form a regenerative latching circuit which receives the stored input current from the first phase and an inverted version of the input current in the present, second, phase.

As disclosed in EP-A-0 744 032, and in related U.S. Pat. No. 5,714,894 the use of the stored input currents plus the inverted version of the input current enables common mode and offset currents to be cancelled. In the arrangement shown in FIG. 1 this cancellation is maintained but because the transistors N1 and N2 are the same transistors as bias the latch in regeneration the penalties discussed in the second paragraph are eliminated or at least reduced.

Figure 2:
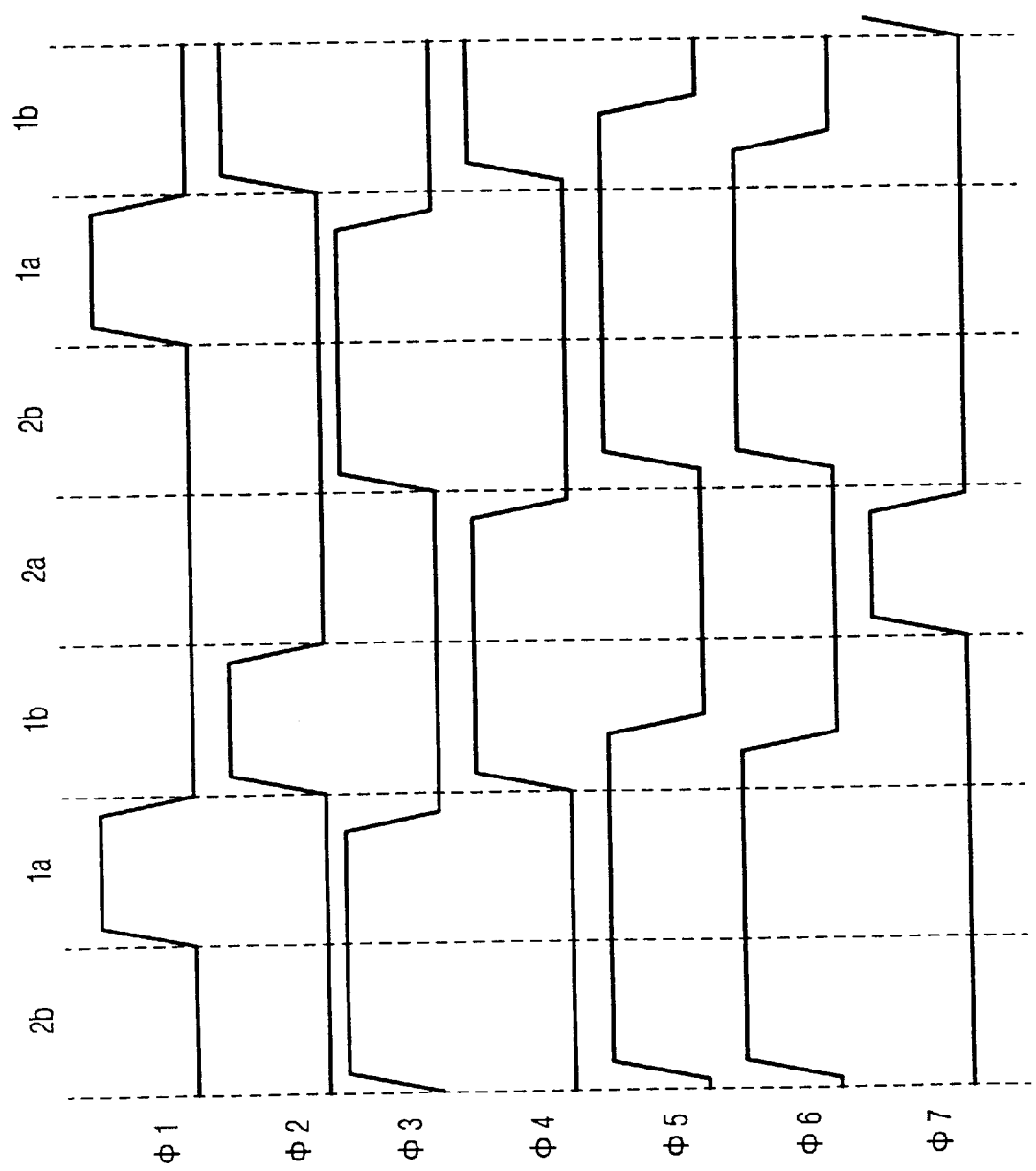
FIG. 2 shows switching waveforms for operating switches in a comparator according to the invention.

FIG. 2 shows clock waveforms which are used to operate switches S1 to S11. Switches S1 and S2 are closed when waveform φ1 is high, switches S3 and S4 are closed when waveform φ2 is high, switches S5 and S6 are closed when waveform φ6 is high, switches S7 and S8 are closed when waveform φ3 is high, switches S9 and S10 are closed when waveform φ4 is high, and switch S11 is closed when waveform φ5 is high.

As shown in FIG. 2 periods 1a,1b,2a and 2b comprise a sample period in a switched current circuit using S21 current memory circuits as disclosed in EP-A-0 608 936 and in related U.S. Pat. No. 5,400,273.

As will be apparent from the foregoing description the period 1a corresponds to the first phase where the input currents together with bias currents produced by transistors P1 and P2 due to switches S5 and S6 being closed are sensed and stored on transistors N1 and N2. During period 1b the memory transistors N1 and N2 produce the current sensed and stored during period 1a as the switches S7 and S8 are open. At the same time switches S1 and S2 open and switches S3 and S4 close which causes the input current difference to be inverted. Also switches S9 and S10 close and S5 and S6 open so that the transistors P1 and P2 form a regenerative latch circuit. During period 2a which corresponds to the third phase of the comparator circuit operation the output of the comparator is valid and may be clocked into subsequent circuits by a switching arrangement (not shown) operated by waveform φ7. During period 2b which corresponds to a fourth phase of the comparator operation switches S5,S6 and S11 close while switches S9 and S10 open causing the comparator to be reset to its initial state to await the input of the next current samples.

It will be apparent to those skilled in the art that the use of the comparator according to the invention is not limited to switched current circuit but can be used wherever the input signal currents can be held constant for the first and second phases. The particular switching waveforms shown in FIG. 2 are merely by way of example where the use with S21 current memory cells is proposed.

Figure 3:
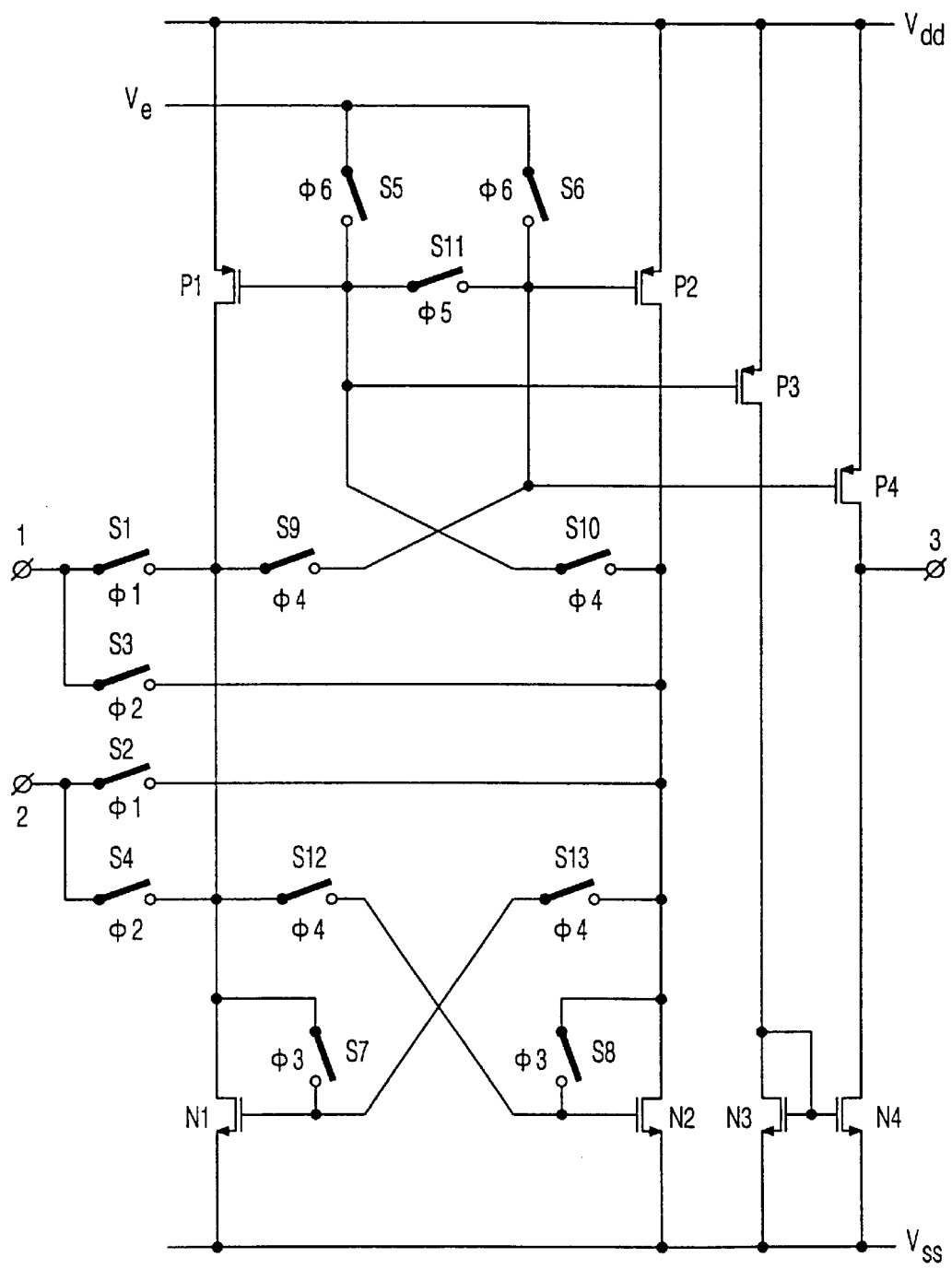
FIG. 3 is a schematic diagram of a second embodiment of a comparator according to the invention.

FIG. 3 shows a second embodiment of a comparator according to the invention and those elements common to the FIG. 1 embodiment have been given the same reference signs. The following description of the comparator shown in FIG. 3 will be directed to the differences between the two embodiments. As shown in FIG. 3 the gate electrode of transistor N1 is additionally connected via a switch S13 to the drain electrode of transistor N2 while the gate electrode of transistor N2 is additionally connected to the drain electrode of transistor N1 via a switch S12. The switches S12 and S13 are closed when waveform φ4 is high, that is at the same time as switches S9 and S10. As a result, the regenerative latch is formed from the transistor pairs N1,P1 and N2,P2 during the second phase and consequently it achieves twice the transconductance of the single transistor latch which enables the comparator to operate at a higher frequency. Otherwise, the operation of the arrangement shown in FIG. 3 corresponds to that shown in FIG. 1.

From reading the present disclosure, other modifications and variations will be apparent to persons skilled in the art. Such modifications and variations may involve equivalent features and other features which are already known in the art and which may be used instead of or in addition to features already disclosed herein. Although claims have been formulated in this Application to particular combinations of features, it should be understood that the scope of the disclosure of the present application includes any and every novel feature or any novel combination of features disclosed herein either explicitly or implicitly and any generalisation thereof, whether or not it relates to the same invention as presently claimed in any Claim and whether or not it mitigates any or all of the same technical problems as does the present invention. The Applicants hereby give notice that new claims may be formulated to such features and/or combinations of such features during prosecution of the present application or of any further application derived therefrom.

What is claimed is:

1. A current comparator comprising:

first and second inputs for receiving first and second input currents, a memory arrangement including first and second current memory circuits and adapted for sensing and storing the received currents during a first phase of a clock signal and reproducing said received currents during a second non-overlapping phase of said clock signal, a latching circuit including first and second cross-coupled transistors, a bias current path including in series the first and second cross-coupled transistors respectively cascaded with the first and second memory circuits, means for feeding the stored and an inverted version of the received currents to the latching circuit during said second non-overlapping phase and means for feeding an output of the latching circuit to an output of the current comparator during a third phase of the clock signal, and first phase means coupled with the latching circuit, engaged during the first phase, for disconnecting the cross-coupling of the first and second transistors and for connecting the first and second transistors as individual current sources each feeding a bias current along the bias current path to a respective one of the first and second memory circuits.

2. A current comparator as claimed in claim 1 in which the first phase means comprises first switching means controlled to be opened on said first phase of the clock signal and second switching means for switchably coupling the first and second transistors to a bias potential source during said first phase of the clock signal.

3. A current comparator as claimed in claim 1 including means for resetting the current comparator to its initial state, the resetting means including the first phase means and further including shorting means for connecting the first and second transistors together.

4. A current comparator as claimed in claim 3 further including switching means controlled for switchably connecting control electrodes of the first and second transistors to a bias potential source during said first phase of the clock signal.

5. A current comparator as claimed in claim 4 wherein each of the first and second current memory circuits includes a MOS transistor having a gate electrode switchably connected to the bias current path.

6. A current comparator as claimed in claim 1 wherein each of the first and second current memory circuits includes a MOS transistor having a gate electrode switchably connected to the bias current path passing the bias current.

7. A current comparator as claimed in claim 6 in which the first phase means comprises first switching means controlled to be opened on said first phase of the clock signal and second switching means for switchably coupling the first and second transistors to a bias potential source during said first phase of the clock signal.

8. A current comparator, responsive to received first and second input currents, the current comparator comprising:

a memory arrangement including first and second current memory circuits and adapted for sensing and storing the received currents during a first phase of a clock signal and reproducing said received currents during a second non-overlapping phase of the clock signal;

a latching circuit including first and second cross coupled transistors;

a bias current path including in series the first and second cross-coupled transistors respectively cascaded with the first and second memory circuits;

a switch-coupled transistor circuit, engaged during the second non-overlapping phase, adapted to feed the stored and an inverted version of the received currents to the latching circuit;

an output driver transistor arrangement adapted to provide an output of the latching circuit to an output of the current comparator during a third phase of the clock signal;

a first switch coupled with the latching circuit and adapted to be engaged during the first phase for disconnecting the cross-coupling of the first and second transistors; and a second switch coupled with the latching circuit and adapted to be engaged during the first phase for connecting the first and second transistors as individual current sources each feeding a bias current along the bias current path to a respective one of the first and second current memory circuits.

9. A current comparator as claimed in claim 8 wherein each of the first and second current memory circuits includes a MOS transistor having a gate electrode switchably connected to the bias current path.

10. A current comparison method for use in a current comparator including a memory arrangement having first and second current memory circuits and adapted for sensing and storing received first and second input currents during a first phase of a clock signal and reproducing said received currents during a second non-overlapping phase of the clock signal, and including a latching circuit having first and second cross coupled transistors, the method comprising:

sensing and storing the received first and second input currents along a bias current path including in series the first and second cross-coupled transistors respectively cascaded with the first and second current memory circuits;

during the second non-overlapping phase of the clock signal, feeding the stored and an inverted version of the received currents to the latching circuit;

during a third phase of the clock signal, providing an output of the latching circuit to an output of the current comparator;

during the first phase of the clock signal, disconnecting the cross-coupling of the first and second transistors; and during the first phase of the clock signal, connecting the first and second transistors as individual current sources each feeding a bias current along the bias current path to a respective one of the first and second current memory circuits.

\* \* \* \* \*